United States Patent [19]

Call et al.

[11] Patent Number: 5,640,381
[45] Date of Patent: Jun. 17, 1997

[54] LASER POWER-DRIVE CIRCUIT HAVING A SCALING DAC SUPPLYING A SCALED REFERENCE SIGNAL TO A PLURALITY OF SCALED DAC'S THAT SUPPLY A PLURALITY OF SCALED OUTPUT SIGNALS

[75] Inventors: David Ernest Call, Hollister; Stephen J. Hrinya; Jerry Elden Hurst, Jr., both of San Jose, all of Calif.; Glen Alan Jaquette, Tucson, Ariz.; Anthony Juliana, Jr., San Jose, Calif.

[73] Assignee: International Business Machines Corporation, Armonk, N.Y.

[21] Appl. No.: 612,993

[22] Filed: Mar. 8, 1996

[51] Int. Cl.⁶ .................................................... G11B 7/00
[52] U.S. Cl. .............................. 369/116; 369/54; 369/47; 369/59; 369/124
[58] Field of Search .......................... 369/116, 54, 53, 369/58, 59, 47, 48, 49, 124, 121, 122; 359/333

[56] References Cited

U.S. PATENT DOCUMENTS 5,172,352  12/1992  Kobayashi .................... 369/116 X
5,436,880  7/1995   Eastman et al. ............... 369/116 X
5,446,716  8/1995   Eastman et al. ............... 369/116 X

*Primary Examiner*—Muhammad N. Edun
*Attorney, Agent, or Firm*—D. A. Shifrin; H. F. Somermeyer

[57] ABSTRACT

An optical disk recorder employs laser drive signals having diverse current or power levels. A scaling digital-analog-converter (DAC) supplies a scaled reference signal to a plurality of scaled DACs. The scaled DACs supply the diverse laser drive signals. Calibrating the scaling DAC calibrates the scaled DACs. A base array of DACs include not only the scaling DAC but a plurality of base array DACs. Such base array DACs control reading operations as well as supplying a threshold current. The threshold current is that laser drive signal current level below which laser 25 does not emit a laser beam. During writing, the CUT current is added to the laser drive currents supplied by the scaled DACs. A desired CUT current is determined by calculating a slope of the laser drive current to emission of radiation. Then the slope is extrapolated to a zero emission point below which no coherent emission of radiation occurs.

20 Claims, 6 Drawing Sheets

HIGH FREQUENCY
MODULATOR HFM
35

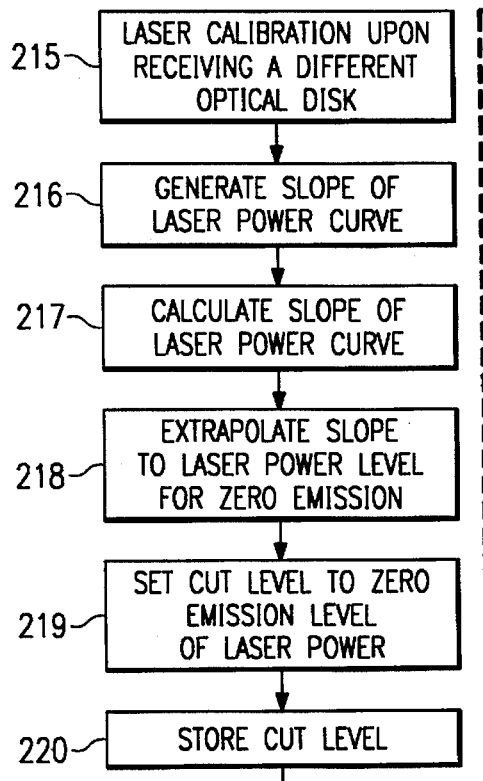
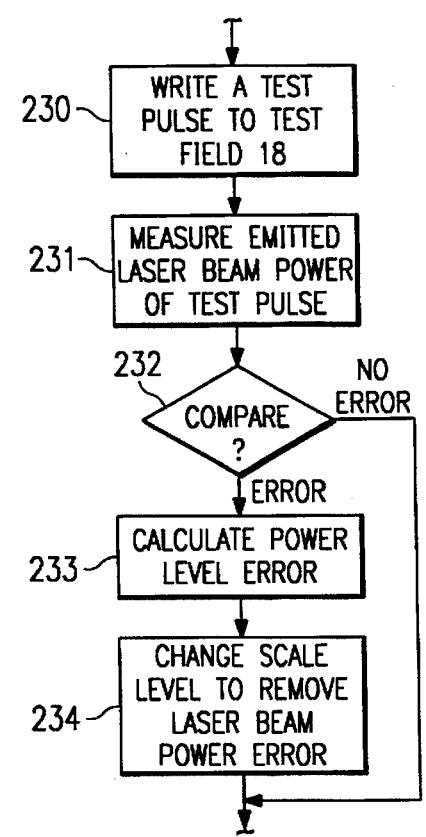
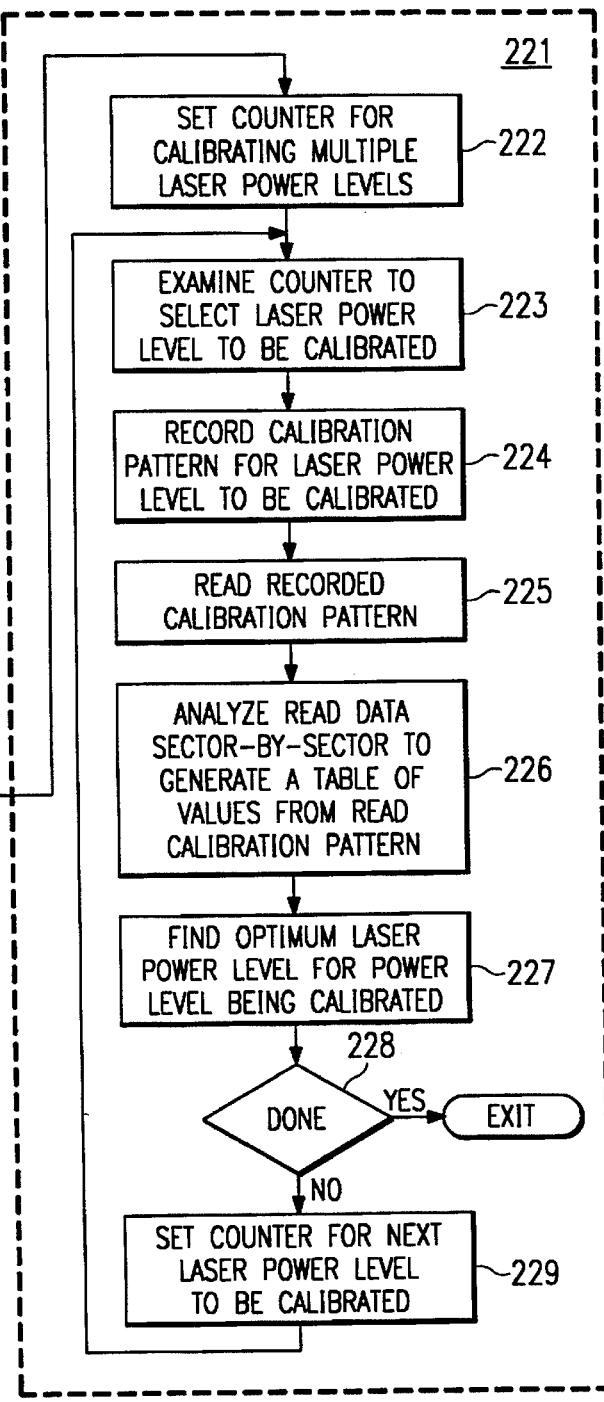
FIG. 9
FIG. 10

LASER POWER-DRIVE CIRCUIT HAVING A SCALING DAC SUPPLYING A SCALED REFERENCE SIGNAL TO A PLURALITY OF SCALED DAC'S THAT SUPPLY A PLURALITY OF SCALED OUTPUT SIGNALS

FIELD OF THE INVENTION

This invention relates to laser beam power level controls, particularly those controls for driving a laser to emit any one of a plurality of beam power levels.

BACKGROUND OF THE INVENTION

Lasers have been controlled with diverse electronic circuits. It is desired to provide a laser control employing an array of digital-to-analog convertors in which calibration of such array is facilitated. Such laser controls find usage in diverse laser applications. One such application is in optical disks.

It is a continuing desire to increase areal density of optical disk recording. One way to increase area density is to increase linear recording density along tracks on the optical disk. Earlier optical disk employ pulse-position modulation (PPM) wherein a pulse in a predefined position along a track indicates a binary one and absence of a pulse at that position indicates a binary zero. It should be borne in mind that rather than representing user data values, such indications indicate 1's and 0's of a recording code, such as the well-known d,k codes. Intersymbol interference (ISI) in PPM recording tends to limit the linear recording density of optical disks. Pulse-width modulation (PWM) can increase linear recording density over PPM recording techniques. PWM introduces a need for an enhanced recording system. One such enhanced PWM recording system is shown in Belser et al U.S. Pat. No. 5,400,313. In the Belser et al patent, a minimal number of circular marks are recorded on the optical disk to record a desired run length code pattern. A preferred coding is a known d,k code having 1,7 parameters. The Belser et al recording system provides for accurately locating pulse signal transitions on the optical disk, a necessity for high-density PWM recording. A plurality of laser recording power levels are used. One level drives the laser for reading. A second level drives the laser for idling. Additional multiple power levels drive the laser for writing data to the optical disk. The multiple power levels for writing are added to the idling or base laser power level. Such base power level is termed a "threshold current" or CUT power level. The threshold is that power level below which the laser does not emit a laser beam. That is, it is the smallest laser drive current level at which the laser emits a coherent beam of radiation. These power levels are determined using recording patterns for accurately obtaining readily detectable recorded PWM signal transitions.

It is also desired to minimize elapsed time between mounting an optical disk and a first access to that mounted optical disk. Since determination of optical device and optical medium conditions that affect laser operations are time consuming, it is desired to reduce calibration time to a minimum without sacrificing an optimal laser writing (recording) and reading operations.

Optical disks have a format of addressable sectors disposed in a spiral track. An optical data disk is rotated relative to a laser beam at a constant angular speed for scaling a laser beam along the spiral track. In contrast, optical video/audio disks are relatively rotated at variable rotational speeds to obtain a constant linear laser beam scanning speed. In any event, while scanning a laser beam along a relatively moving spiral track, automatic track following techniques keep the beam on the spiral track. This arrangement applies to both rewriteable and write-once optical disks. In optical data disks it is usual in each sector to have an address portion, herein termed identification (ID) portion, and a data-recording portion. Any type or format of data may be stored in such data-recording portion. In rewriteable optical disks, such as magneto-optical and phase-change disk, a write power qualification or test field may be disposed between the ID portion and the data-storing portion. This field is termed Automatic Laser Power Correction (ALPC) in which write pulses are recorded to qualify a laser write power level before recording. Qualifications of the laser write power (sufficient power to reliably record in the data-storing area but not excessive power) is termed Automatic Laser Power Qualification (ALPQ). It is to be understood that many known details other than set forth herein are used in writing data to and reading data from optical disks.

DISCUSSION OF PRIOR ART

A multi-power-level PWM recording system is shown in Belser et al U.S. Pat. No. 5,400,313, supra. This invention provides, inter alia, enhanced write power level controls not shown in the Belser et al patent that can be automatically calibrated for writing data by calibrating only one digital-to-analog converter (DAC).

Generally, a calibration of laser power levels is well known, such as shown in the Call et al U.S. Pat. No. 5,216,659. Call et al show a laser power level beam emission slope useful in calibrating a laser. U.S. Pat. No. 5,185,734 by Call et al shows calibrating a laser power controlling digital-to-analog converter (DAC). This calibration facilitates digital control of emitted laser power beam intensity.

Fennema et al in U.S. Pat. No. 5,136,569 show techniques for calibration sequencing based upon type of optical disk to be accessed, i.e., rewriteable, read only or write once read only (WORM).

Co-pending commonly-assigned application for patent Ser. No. 08/319,179, filed Oct. 6, 1994, shows using the above referenced ALPC field, also termed a test field herein. A laser test pulse records a test signal in the ALPC field. During the recording, the laser beam intensity is measured and evaluated. If the laser beam intensity is out of an acceptable range of values, then recording is inhibited until a satisfactory calibration can be achieved. The ALPC field, in accordance with this application, is not only used for checking but also for real-time power-level tuning intensity of a laser beam. The present invention provides an additional new use for the ALPC field or other recordable fields in an optical disk.

SUMMARY OF THE INVENTION

It is an object of this invention to control a laser in a manner to accurately emit any one of a plurality of laser beam intensities in a manner to enable one calibration to effectively calibrate all of the laser beam intensities to a desired laser power.

It is an object of this invention to provide a laser control that accurately scales laser power levels during laser operations to an optimum laser power.

A scaling DAC supplies a scaling reference signal to scale operation of a plurality of scaled power DACs for supplying output laser power level signals that drive a laser, such as for writing data to an optical disk. Calibrating the scaling DAC automatically calibrates operation defined by the scaled power DACs. Maintaining a constant ratio of power levels of the scaled power DACs provides for an optimum laser operation.

A base array has a plurality of base-array DACs plus a scaling DAC. A primary reference signal provides a constant operation of the DACs in the base array. The base-array DACs supply laser control signals for predetermined laser operations, such as for reading an optical disk and for providing a CUT laser signal. The laser drive signals supplied by the scaled DACs are added to the CUT laser power signal. At any one instance, one or more of the power levels may be active. The summed current output is a series of laser drive signals for actuating a laser to provide a varying power laser beam intensity, such as for recording PWM signals on an optical disk. The laser beam is directed at a suitable target, such as an optical disk.

To maintain optimum laser operation, a test section on the targets, such as sectors on an optical disk, is employed for tuning the scaling reference signal. A laser test beam intensity is compared with a desired optimum beam intensity. Detected deviations from the desired optimum intensity results in adjusting the scaling reference signal.

The foregoing and other objects, features and advantages of the invention will be apparent from the following more particular description of preferred embodiments of the invention, as illustrated in the accompanying drawings.

DESCRIPTION OF THE DRAWING

FIGS. 9 and 10 are machine-operation flow charts showing calibration and tuning laser operations.

The foregoing and other objects, features and advantages of the invention will be apparent from the following more particular description of preferred embodiments of the invention, as illustrated in the accompanying drawings.

DETAILED DESCRIPTION

Figure 1:
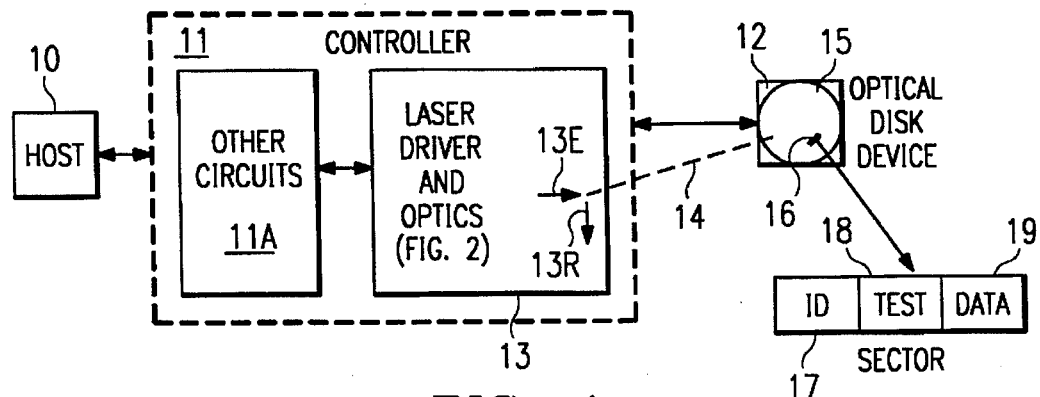
FIG. 1 illustrates, in simplified form, an optical disk drive or device and a controller in which the present invention may be advantageously employed.

Referring now more particularly to the appended drawing, like numerals indicate like parts and structural features in the various figures. FIG. 1 shows a host processor 10 connected to a peripheral controller 11 for accessing and controlling an optical disk device 12. Optical disk device 12 removably receives an optical disk 15 of any type. The present description describes writing PWM signals on and reading PWM signals from a magneto-optical disk 15. As usual for optical disks, disk 15 has a spiral track represented by a single sector 16. A multiplicity of such sectors resides in optical disk 15. Sector 16 is detailed for shown three fields of interest to the current description. File 17 is the identification (ID) field having sector address information. Test field 18 is the ALPC field described above. Test field 18 is used to adjust a later-described scaling reference signal. Third field data 19 stores user data. Controller 11 has "other circuits" 11A. Other circuits 11A are those circuits usually found in optical disk controllers. Such other circuits 11A include one or more microprocessors for controlling optical disk device 12. Controller 11 may attach more than one optical disk device 12.

In accordance with the present invention, an enhanced laser driver 13 is provided in controller 11 for improving writing and reading of data on and from optical disk 15 plus an optical detector that detects an information in a laser beam reflected from disk 15. Optical path 14 connects optics 27 (not detailed herein) in laser driver 13 to optical disk 15 in a usual manner. Arrow 13E represents emission of a laser beam from optics 27 to optical path 14. Arrow 13R represents receiving a reflected laser beam from optical disk, such as in reading data from optical disk 15. Automatically calibrating a single laser power scaling reference signal (FIG. 2) automatically calibrates all writing power levels used in optical device 12, as will become apparent.

Figure 8:
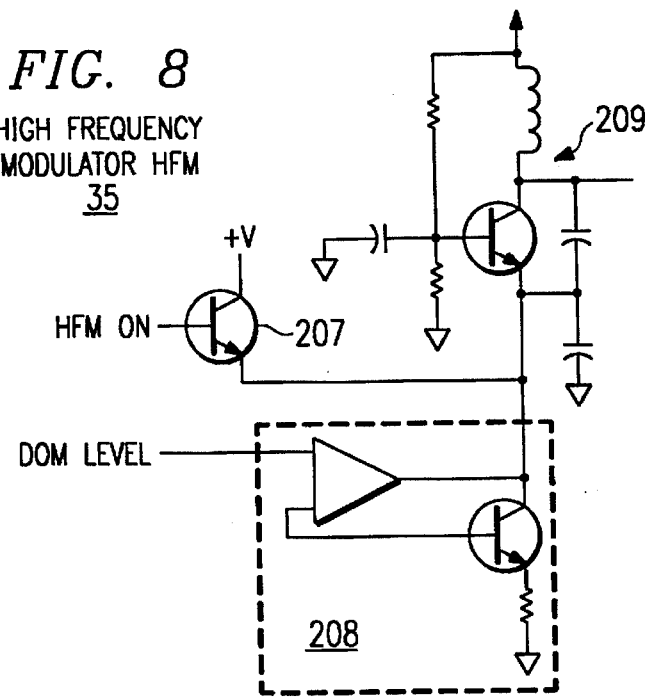
FIG. 8 shows a high frequency modulator (HFM) used in the FIG. 2 illustrated laser driver.

Laser driver and optics 13 actuate laser 25 (FIG. 2) to operate in any one of a plurality of modes. The OFF mode supplies zero power to the laser. Changing laser 25 operation from the OFF mode requires a command generated in controller 11. A READ ID mode is used while scanning the ID field 17 of each sector being accessed irrespectively of whether reading, writing or erasing is to occur in the data field. The laser current during reading is a DC signal modulated by a radio frequency (RF) supplied by a high frequency modulator (HFM) (FIG. 8). This mode also applies to reading data fields 19 of the disk 15 sectors. A READ DATA mode is similar to the READ ID mode but at a lower read laser power level. The READ DATA mode is also employed for scanning data fields 19 without reading the recorded data, i.e., as in reading ID fields while searching for an addressed sector for reading or writing. A WRITE mode actuates laser 25 to write PWM signals on disk 15. This mode employs principles of the present invention to generate laser drive signals having a plurality of power levels. In the WRITE mode, laser power servoing used in reading is disabled. An ERASE mode erases data from data portions of addressed sectors. A continuous amplitude laser power level P erases data from data portions of addressed disk sectors. An ALPC mode records a defined set of laser 25 emitted beam pulses in test field 18 used to qualify the laser operation for recording data. As described above, the laser qualification is termed ALPQ. In accordance with the present invention, the laser beam power intensity level is measured while recording the laser beam for adjusting or tuning the write power levels. Such adjusting or tuning is accomplished by changing an input signal to a scaling DAC which in turn changes the operation of the scaled power DACs.

Figure 2:
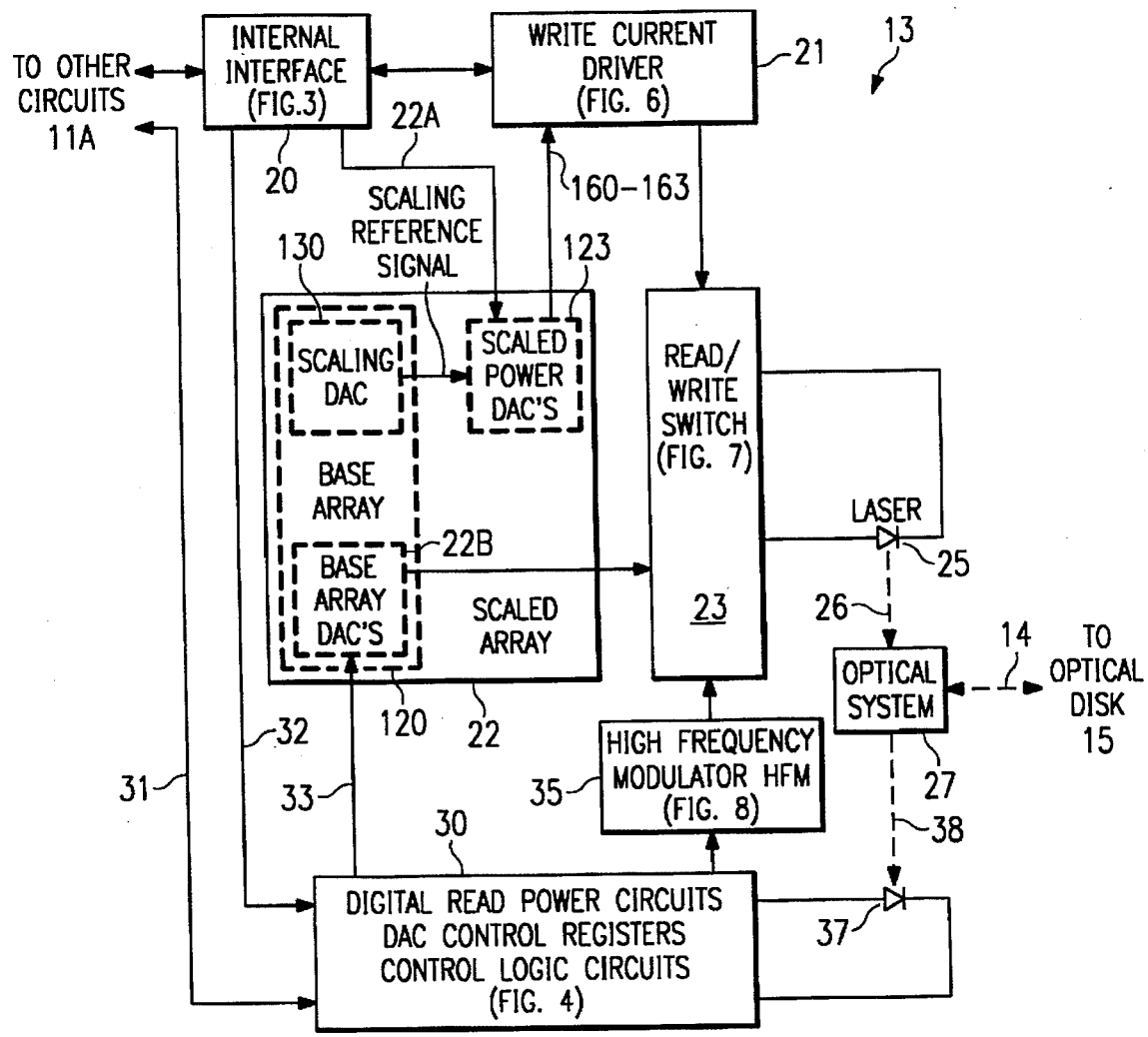
FIG. 2 is a simplified block diagram of a laser driver constructed in accordance with the present invention.

In accordance with an aspect of the present invention, a simple scaling algorithm, partially illustrated in the FIG. 2 illustrated circuits, enables a rapid recalibration and effectively real-time power level tuning of laser 25. Specifically, an optical writing system having N distinct write power levels $P_1$ through $P_M$ is described by an equivalent set of parameters $P_1$; $P_2/P_1$; ... $P_N/P_1$. Since many variables affect a desired optimum laser power $P_1$ but not the ratios defining a set of parameters, $P_1$ can be scaled to the set of parameters while holding the ratios between the parameters in the set constant. Therefore, recalibrating power level $P_1$ recalibrates all of the laser 25 power levels. This fact eliminates multiple calibrations for enabling effective real-time tuning of laser 25 operation. This methodology is applicable to not only optical recorders that employ magneto-optical disks, but also to phase-change, write once and optical master disks, as well as other optical devices. In a constructed embodiment of this invention, a scaling DAC supplies a scaling reference signal to a plurality of DACs in a so-called scaled array of DACs. $P_1$ corresponds to the scaling DAC and the ratios in the set of parameters correspond to DACs in the scaled array, all as best understood by referring to FIGS. 2 and 5.

Figure 3:
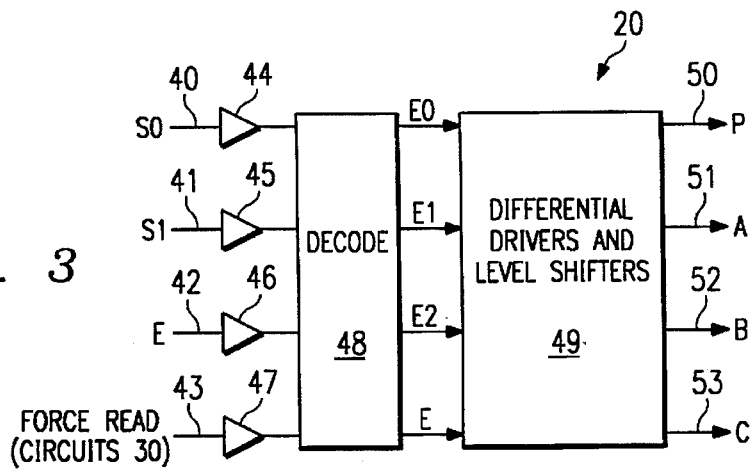
FIG. 3 is a simplified block diagram of an internal interface between the FIG. 2 illustrated laser driver and other circuits of an optical disk controller shown in FIG. 1.
Figure 6:
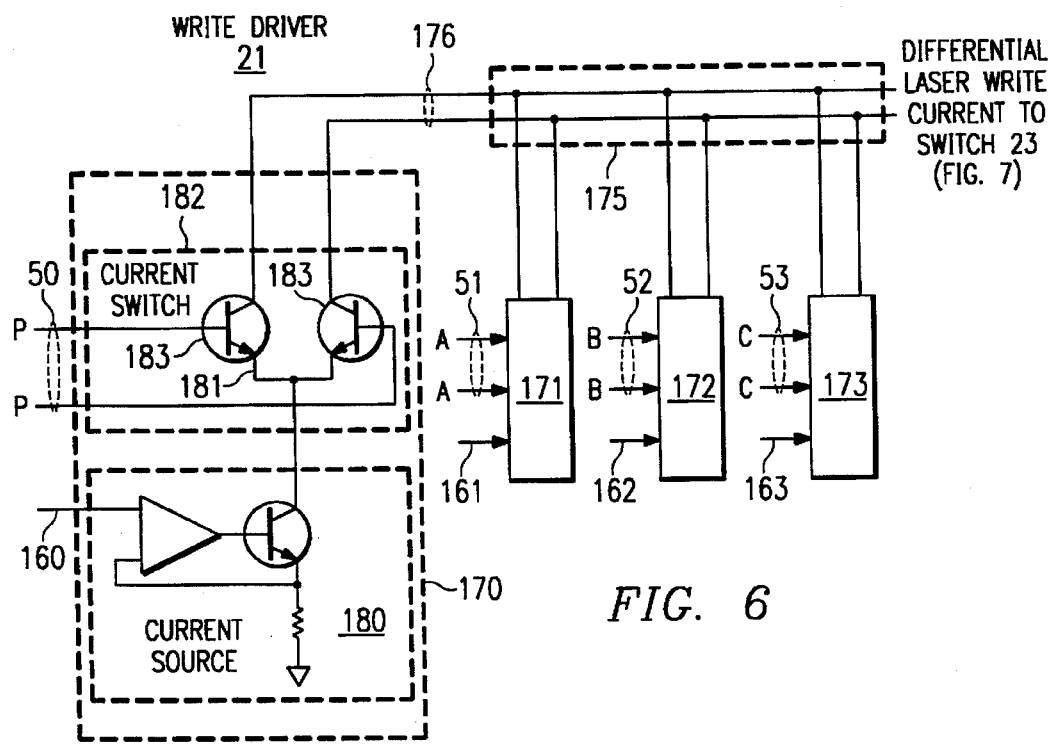
FIG. 6 illustrates a laser write-current driver used in the FIG. 2 illustrated laser driver.
Figure 7:
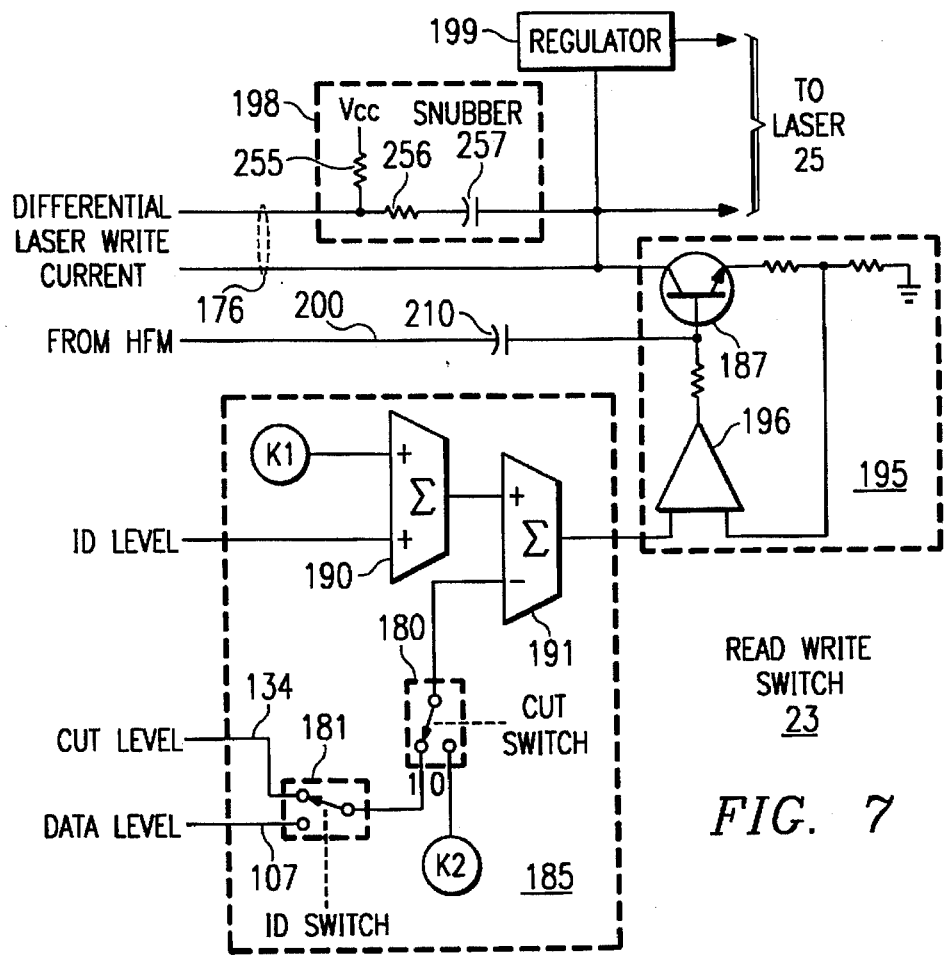
FIG. 7 illustrates a read/write switch used in the FIG. 2 illustrated laser driver.

The FIG. 2 illustrated laser driver 13 has internal interface circuits 20 (FIG. 3) for connecting the FIG. 2 illustrated circuits to other circuits 11A. Internal interface 20 connects directly to write current driver 21, shown in FIG. 6 for supplying data indicating signals to actuate the write current driver. The described write current driver 21 illustrates a preferred write driver for practicing the present invention. Control DACs 22 are connected to write current driver 21 for supplying signals having diverse laser power levels, as will become apparent. Control DAC's 22 and write current driver 21 jointly control operation of and supply laser power level signals to read/write switch 23 (FIG. 7). Control DACs 22 are divided into two DAC arrays. In accordance with one aspect of this invention, base array 120 includes scaling DAC 130 and base array DACs 22B. Scaling DAC 130 supplies an analog scaling reference signal to the scaled DACs 150–153 of scaled array 123. Scaled DACs 150–153 receives digital data signals over bus 21A from an internal interface for supplying, based upon scaling reference signal, analog laser write signals to write current driver 21. Base array DACs 22B supply later-described analog laser control signals to read/write switch 23.

Read/write switch 23 is connected to laser 25 for supplying laser drive pulses for actuating laser 25 to emit desired laser beam pulses, as will become apparent. Laser 25 emits a laser beam over light path 26 to optical system 27. Optical system 27 includes the usual focusing lens, beam splitters and the like, all as is well known. Optical system 27 emits the laser beam through the focussing lens (not shown) over light path 14 to optical disk 15 (FIG. 1). Some so-called waste light from the laser 15 beam traverses over a light path 38 to a photo sensitive diode 37, as detailed later.

Internal interface 20 is connected over multiple paths. Multiple-path conductor 32 to a digital read-power circuit, DAC control registers and control logic 30, hereinafter circuits 30. Circuits 30 are connected over multiple-path conductor 31 to other circuits 11A for receiving later-described control signals (commands). DAC control registers in circuits 30 supply DAC control signals over path 33 to the control DAC's 22. A high frequency modulator (HFM) 35 responds to an actuating signal from circuits 30 to supply a radio frequency (RF) signal to read/write switch 23 for use while reading data from optical disk 15. Circuits 30 receive an electrical signal from a photo sensitive diode 37 to sense the intensity of the optical path 38 light beam and perform later-described laser-power tuning operations.

Internal interface 20 (FIG. 3) receives data-indicating differential signals over differential lines 40–42, each set of differential lines including two electrical conductors. The values S0, S1 and E are input parameters set forth in Table I below.

TABLE I

| Write Gate | E | S0 | S1 | POWER |
|---|---|---|---|---|
| 1 | 0 | X | X | IDLE(CUT) |
| 1 | 1 | 0 | 0 | P level PL |
| 1 | 1 | 0 | 1 | C level CL |
| 1 | 1 | 1 | 0 | B level BL |
| 1 | 1 | 1 | 1 | A level AL |
| 0 | 0 | X | X | Read level |
| 0 | 1 | X | X | Invalid |

In Table I, a binary 1 indicates an active parameter, a binary 0 indicates an inactive parameter and X indicates that a respective parameter does not participate in determining power level. Write Gate being a binary 1 means that writing is to occur. A binary 0 write gate indicates that writing is not to occur. The term CUT corresponds to the threshold current below which laser 25 stops emitting a laser beam. The "E" input is active whenever a write pulse is being issued. Such preheat and use of four laser write power levels are described in co-pending commonly-assigned application for patent Hurst Ser. No. 08,342,196, filed Nov. 18, 1994. Later-described Table II below shows the relationship of the write driver 21 operation and the laser current write levels. S0 and S1 parameters indicate which of the four laser beam power levels (P, A, B and C) are to be used in writing. A definition of these power levels is found in Belser et al U.S. Pat. No. 5,400,313, supra. S0 and S1 encode the four power levels into two binary digits. FIG. 6 provides a better understanding of generating a laser drive signal. The INVALID line in Table I is an error-indication.

Amplifiers 44–46 amplify and supply differential signals S0, S1 and E to decode circuit 48. The decode circuit implements the signal decoding shown in Table I. Force read signal received over line 43 from circuits 30 is first level translated in receiver 47 before driving decode 48 to disable write driver 21. In response to the received digital signals S0, S1, E and force read, decode 48 supplies differential signals E0, E1, E2 and E through differential drivers and level shifters 49 to output lines P 50, A 51, B 52 and C 53, respectively. Lines 50–53 carry the write differential digital control signals to write current driver 21, best seen in FIG. 6.

Circuits 30 (FIG. 4) receive an electrical signal from waste light photosensitive diode 37. A transconductance amplifier 60 and variable resistor respond to the diode 37 electrical signal to supply a laser 25 emitted beam intensity indication to analog-to-digital converter (ADC) 63. Deserializer 70 continuously receives the digitized value of the laser 25 beam intensity for distribution to ADC register 71, under/over power check circuit 72 and to ALPC register 112. ADC 63 is synchronized to the above-referred to the ALPC or laser test signal (not shown). Check circuit 72 continuously monitors the diode 37 indicated laser beam intensity for detecting laser beam intensity errors to supply any detected error status over lines 75 to status register 76. Register 76 forwards error status, if any, over lines 77 to other circuits 11A in a usual manner. Status register 76 may also supply control signals over bus 78 to control register 85, such as for turning laser 25 off whenever an overpower condition is detected, and the like.

Other circuits 11A control operation of circuits 30 via serial I/O register interface 80. Interface 80 receives control data, such as set points, from other circuits 11A for distribution over bus 81 to ID power set point register 83, data power set point register 84, base array DAC's 22B and control register 85. Registers 83 and 84 respectively receive and store read power level settings used for reading the ID and data portions of each sector of optical disk 15.

Multiplexor (MUX) 90 times the transmission of the registers 83–84 stored values to either ID DAC 102 (FIG. 5) or to DATA DAC 103 (FIG. 5), as will become apparent. MUX 90 supplies the transferred digital value to digital summer 91. Digital summer 91 subtracts ID or DATA register contents from the ADC sample, sending the resulting calculated loop error value onto multi line digital bus 92. Digital bus 92 is connected to one digital input of each of digital summers 95 and 96. The digital input to ID DAC 102 is generated by a feedback calculating arrangement of J-bit (J is a positive integer) accumulator 98 supplies a feedback digital signal to a second input of digital summer 95. This feedback servo arrangement accumulates successive samples of loop error (bus 92). The accumulated error signal flows through digital serializer 100, then over line 104 to ID DAC 102. The DATA level digital signal transmitted over line 105 to DATA DAC 105 is identically generated by K-bit accumulator 99, digital summer 96 and serializer 101. In a constructed embodiment, the values J and K are double-digit decimal numbers with J being greater than K.

For verifying proper operation of read control circuits (items 83–101), digital bus 92 also carries the output of digital summer 91 to loop error limit check circuit 109. Circuit 109 consists of a plurality of digital comparators that compare the digital bus 92 values with over power and under power limit digital values. Detected power level values on digital bus 92 are indicated over lines 111 to status register 76. Status register 76 transmits the error indications to other circuits 11A, as is known.

Laser 25 write-power tuning adjustments are made using test field 18 (FIG. 1) that is also termed ALPC. Controller 11 senses the onset of test field 18 to which a laser test pulse is to be beamed. Controller 11 supplies an ALPC test digital amplitude-indicating signal over line 113 to ALPC register 112. ALPC register 112 while enabled by the line 113 signal receives the serialized digital data from deserializer 70 that is representative of the laser 25 emitted laser power level to the ALPC field. ALPQ set point register 114 is loaded with a desired emitted laser beam power level (set point). Upon ending the scan of test field 18, control register 85 receives an instruction bit over bus 81 for actuating an ALPC to ALPQ check circuit to compare the ALPC register stored value with the register 114 stored value. If there is a predetermined difference between the two stored values in registers 112 and 114, then an adjustment of emitted laser power is needed. Check circuit 115 supplies an error signal to status register 76 for transmittal to other circuits 11A.

Control logic 110, constructed in a usual manner for controlling laser 25, receives an actuating signal from control register 85 to enter the above-described read mode operation. Control logic 110 responds to the read mode to supply FORCE READ signal over line 43 to internal interface 20 (FIG. 2) and to time and actuate the above-described read mode circuits. The timing is derived by control logic 110 in a usual manner from disk device 12. Optical disk device senses the usual format indicating marks on disk 15 such as an ID mark indicating onset of scanning an ID portion of a sector and a DATA mark indicating scanning of a data portion of a disk 15 sector being scanned by the laser 25 beam. For example, an ID mark signal (not shown) received over line 118 for actuating control logic 110 to supply a read ID control signal over line 116 to MUX 90 to pass the register 83 digital values to digital summer 91 and to actuate J-bit accumulator 98 to calculate the ID LEVEL signal for line 104. Similarly, a DATA mark signal received over line 120 actuates control logic 110 to stop J-bit accumulator 98 from generating the ID LEVEL digital signals and to actuate the K-bit accumulator 99 to generate the line 105 digital signal DATA LEVEL. Control logic 110 also provides other sequencing and timing controls not pertinent to the present invention, all indicated by the lines collectively indicated by numeral 123.

Figure 5:
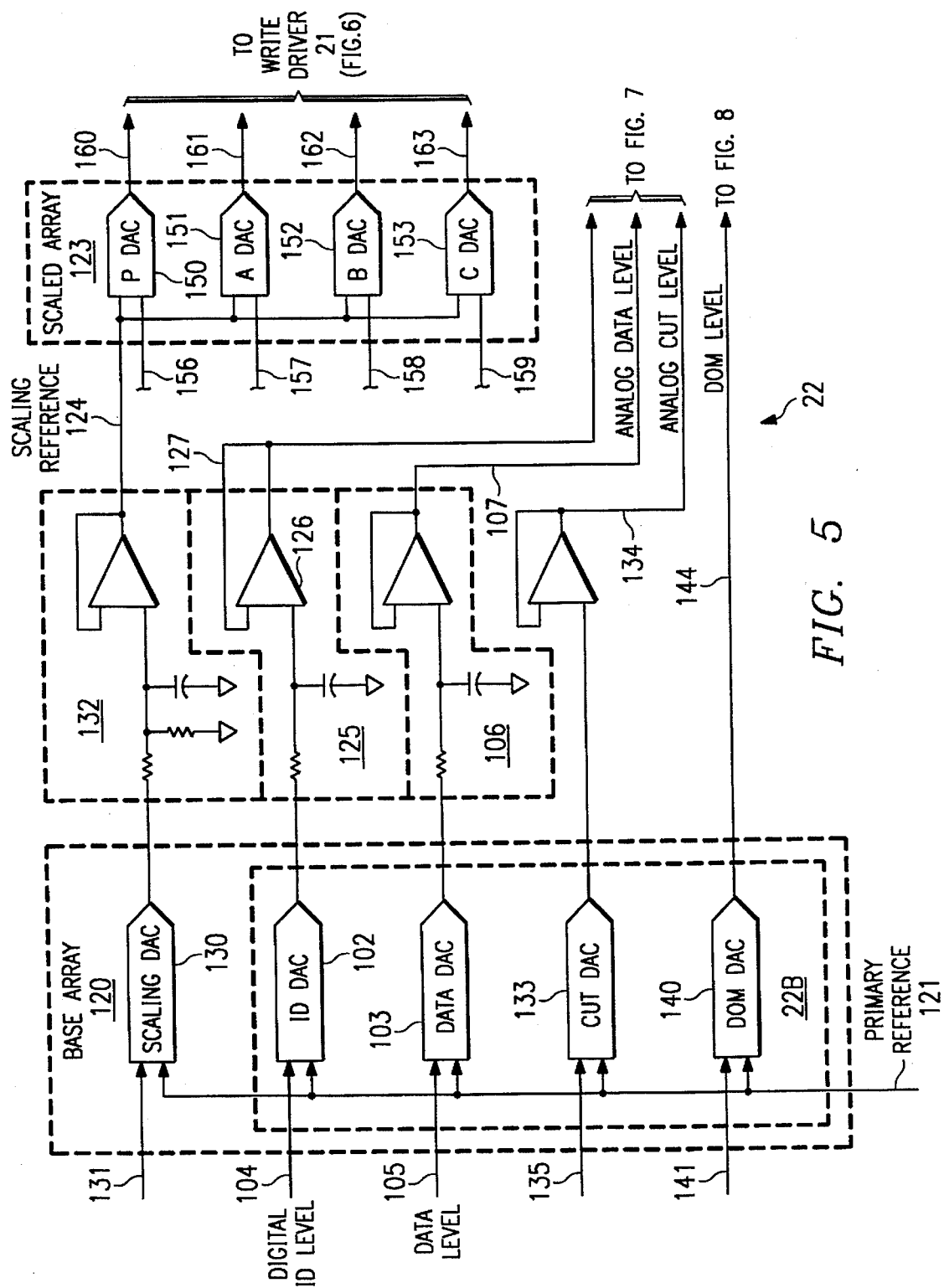
FIG. 5 is a simplified diagram of a digital-to-analog converter (DAC) arrangement used to practice certain aspects of the present invention in the FIG. 2 illustrated laser driver.

The FIG. 5 illustrated DAC arrays supply analog laser drive signals generated from digital inputs, as will become apparent. A base array 120 of a plurality of DAC's respond to the digital inputs to generate output analog signals based on primary analog reference signal on line 121. Each of the DAC's in base array 120 supply an analog output signal, the scaling DAC output analog scaling reference signal is the analog reference signal, that is a proportion of the line 121 primary reference signal in accordance with the respective DAC digital input values. Such analog output signals and the analog scaling reference signal may be amplified within the respective DAC's.

A second or scaled array of DAC's 123 receives the analog scaling reference signal over line 124 from scaling DAC 130. Each of the DAC's in scaled array 123 responds to respective digital input values to supply an analog output signal that is a proportion of the scaled reference value as indicated by the respective digital inputs. In the present illustration, the DAC's in scaled array 123 generate write laser drive signals for creating a plurality of laser write power levels for recording PWM signals on disk 15. Adjusting the digital input in scaling DAC 130 scales operation of all of the scaled array DACs enabling calibrations only of scaling DAC 130 to calibrate all writing operation with one calibration. All DAC's in base array 120, except for scaling DAC 130, supply analog output signals to read/write switch circuits 23 for effecting all of the above-described modes of laser operation. Setting and tuning scaling DAC 125 operation via line 131 is described later with respect to FIGS. 9 and 10. Circuit 132 attenuates and buffers scaling DAC 130 supplied signal as the analog scaling reference signal on line 124.

DAC's in the base array 120 include previously-described ID DAC 102. The ID DAC 102 output analog signal passes through filter 125, then through buffer amplifier 126 for supplying an analog ID LEVEL signal overline 127 to later-described FIG. 7 circuits. DATA DAC 103 supplies its analog signal through filter circuit 106 over line 107 to later-described circuits shown in FIG. 7. CUT DAC 133, also termed a base DAC, supplies a current value over line 134 to later-described circuits shown in FIG. 7. CUT DAC 133 supplies a current to laser 25 that is less than a minimum laser threshold current at which laser 25 still emits a laser beam. Setting CUT DAC 133 via line 135 is later described. Note that the digital values in Scaling DAC 130 and CUT DAC 133 during normal laser 25 operations are constants. Depth-of-modulation DOM DAC 140 also receives a constant digital value over line 141 from other circuits 11A. The depth of modulation is empirically determined. DOM DAC 140 supplies its analog DOM LEVEL signal over line 144 to the FIG. 8 illustrated HFM circuit 35.

The use of the CUT level during writing or erasing is without laser power level servoing as in the read mode. RF modulation is also turned off. The CUT level current from CUT DAC 133 is summed with the write or erase laser drive currents as shown in FIG. 7 at the collector of transistor 187.

Scaled array 123 has four laser write power DACs P DAC 150, A DAC 151, B DAC 152 and C DAC 153. Input liens 156–159 respectively supply digital laser write power values to power DACs 150–153 and to base DACs 102, 103, 133 and 140. Write laser output liens 160–163 respectively carry the laser write power signals to write driver 21 shown in FIG. 6. Digital values on lines 156–159 are generated as shown in FIG. 9. Such digital values, for the purposes of this description are constants having a fixed or set ratio between the constant values.

Write driver 21 (FIG. 6) has four switched current sources 170–173 respectively to switch laser write currents P, A, B and C on and off. Current sources 170–173 supply their respective laser drive level signals to current summer 175 for generating a single differential laser write current. The single differential laser write current flows through differential pair of conductors 176 to laser read/write switch 23. Power DAC's 150–153 respectively supply current over liens 160–163 to switched current sources 170–173. Since all four switched current sources 170–173 are identically constructed, only switched current source 170 is shown in detail. The description of switched current source 170 applies to switched current sources 171–173. The line 160 current drives current source 180 to supply a current to common emitter connection 181 in current switch 182. Emitter-coupled transistor pair 183 responds to the differential line pair 50 signal from internal interface 20 (FIG. 3) to either block the current source 180 current or pass the current to current summer 175 as set forth below in TABLE II. Remember that the differential lines 50–53 signals are derived from signals received from other circuits 11A as described with respect to FIG. 3. The Hurst co-pending commonly-assigned application sets forth details of the multiple current levels.

The multiple current levels of the single differential laser write current levels PL, AL, BL and CL are equal to the combinations of P, A, B and C write driver current levels as set forth below:

TABLE II

| SINGLE DIFFERENTIAL WRITE CURRENT POWER LEVEL | COMBINATION OF P, A, B AND C POWER LEVELS FROM WRITE DRIVER TO GENERATE A LASER POWER LEVEL |
|---|---|
| PL | P |
| AL | P, A, B AND C |
| BL | P, B AND C |
| CL | P AND C |

From Table II it is seen that the current levels AL>BL>CL>PL>CUT. Write driver 21 generates the highest current level AL by turning on all of the switched current sources 170–173. The other current levels are similarly generated. To effect scaled laser power generation, the current levels P, A, B and C have constant ratios. Such constant ratios enable calibrating the scaling reference signal effects calibration of all power DAC's 150–153

The FIG. 7 illustrated read/write switch circuit 23 connects to laser 25 for coupling all of the above-described laser drive currents to laser 25. Table III below shows a logic of operation of the read/write switch circuit 23.

TABLE III

| Switch 180 | Switch 181 | Mode | Current Value | Range of Current |
|---|---|---|---|---|
| 0 | X | Write | ID + K1 − K2 | TH |
| 1 | 1 | READ/ID | ID + K1 − CUT | TH − K4 to TH + K3 |
| 1 | 0 | READ/DATA | ID + K1 − DATA | TH − K4 to TH + K3 |

The "0" values of TABLE III indicate that the respective switch 180, 181 is on the 0 terminal while a "1" indicates the switch is on the 1 terminal. TH refers to the laser 25 threshold (CUT) drive current level below which no emission of radiation occurs. Constants Kn (1–4) are empirically determined constant currents. CUT and DATA represent the CUT level and the DATA level respectively on lines 134 and 107. In the Range of Current column, TH indicates the threshold or minimum current level at laser 25 still emits a laser beam. K3 and K4 are empirically determined tolerances of the laser.

The logic of operation illustrated of TABLE III is effected by the current level input circuits 185. The mode column of TABLE III indicates that controller 11 is respectively in the write mode, READ ID mode or the READ DATA mode by setting switches 180 and 181 as indicated in TABLE III. During writing, circuits 185 supply only the threshold current value CUT. The differential laser write current is received from write driver 21 over differential pair of conductors 176. The received differential laser write current is summed with current TH at the collector of transistor 187. In the read modes, first analog summer 190 sums constant current K1 to the ID LEVEL signal on line 127. Analog summer 190 supplies the sum signal to one input of second analog summer 191. Second analog summer 191 subtracts the output current from switch 180 from the first analog summer 190 to DC level circuit 195 that includes NPN transistor 187. Switches 180 and 181 determine the DC level of circuit 195. High speed amplifier 196 responds to analog summers 191 and 192 to drive transistor 187 to produce the laser DC drive current. A high frequency modulation HFM 35 supplied signal travels from high frequency modulator 35 over line 200 through small isolating capacitor 210 to the base electrode of transistor 187. Transistor 187 provides some gain for the HFM signal reducing power requirements for the HFM circuit 35. This HFM signal provides high frequency modulation of the read current. During reading, no differential write current signals are supplied over lines 176. Currents flowing from write driver 21 goes into snubber circuit 198. Series pass DC regulator 199 biases laser 25 in a manner to provide (sufficient overhead) current to write driver 21 yet minimizing power dissipation. DC regulator 199 makes the write voltage constant and independent of a voltage drop across laser 25.

In the write mode, transistor 187 passes the CUT laser drive signal to laser 25. A second line of the conductor pair 176 drives snubber circuit 198. Snubber circuit 198 absorbs transient voltage produced when a fast write pulse current edge is switched into the laser 25 inductance. This fast write pulse can potentially current saturate the write switch transistors (FIG. 6). Series RC combination 256–257 absorbs the transient. An additional resistor 255 connected to voltage source VCC generates a voltage edge coincident to and of opposite phase from the transient voltage generated by the laser 25 inductance as the fast write pulse is switched to laser 25. The voltage at the junction of resistors 255 and 256 enhance the effect of the series RC combination 256-257 allowing a smaller capacitor 257 to be used while still absorbing the write pulse transient.

During a read mode, all of the write current is a constant DC that flows through resistor 255. RC snubber circuit 198 absorbs some of the RF modulation energy from HFM 35. However, because of the use of a smaller RC value, the RF loss in the read mode is smaller than it would be without snubber circuit 198.

HFM 35 (FIG. 8) consists of a Colpitts oscillator generally denoted by numeral 205. The HFM ON signal received from other circuits 11A makes transistor 207 non-conductive to enable oscillator 205. While transistor 207 is conductive, oscillator 205 is quiesced. The oscillation amplitude is controlled by the DOM LEVEL signal on line 144. The DOM LEVEL signal sets current source 208 to bias oscillator 205. When transistor 207 is conductive, then the current for current source 208 is redirected through transistor 207 rather than through oscillator 205.

Figure 4:
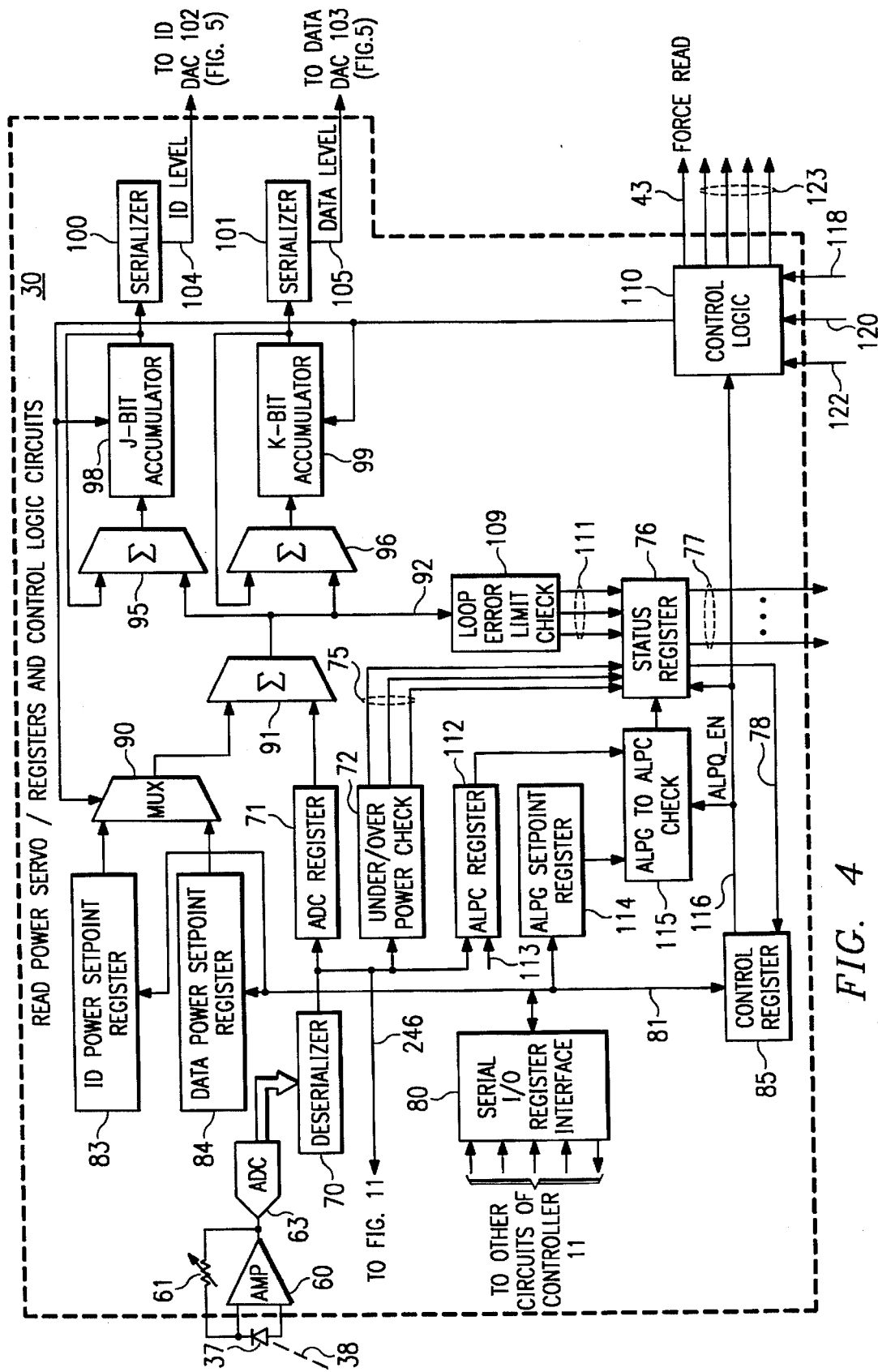
FIG. 4 is a simplified block diagram of a digital control means having a read-power circuit, control registers and other control logic used in the FIG. 2 illustrated laser driver.

FIG. 9 illustrates an initial automatic calibration of laser 25 for emitting a laser beam having a plurality of laser beam power levels. The laser power levels are to have a fixed power relationship with respect to each other. For ensuring accurate generation of the next-described laser power level calibrations, it is preferred that photo diode 37 operation be first calibrated by measuring laser emitted optical power with a power meter. The laser power level calibrations are initiated at step 215 each time an optical disk 15 is newly received into optical device 12 and at power up with an optical disk 15 residing in the optical device. If an optical disk has been previously calibrated to the laser in a receiving optical disk device, then previous calibration power levels recorded on such disk may be used. Step 216 generates a laser power level to laser beam emission level slope such as shown in Call et al U.S. Pat. No. 5,216,659, supra. Two different laser power levels are supplied to laser 25 in a linear range of a laser power curve. The resultant laser beam is detected by photo diode 37 (FIG. 4). The resultant measured laser beam intensity values are captured in ADC register 71, then transferred through internal interface 80 to other circuits 11A. Step 217, performed in a programmed processor (not shown) in other circuits 11A, calculate the slope of the generate laser power curve. Step 218, also performed in the programmed processor, extrapolates the slope (slope is in a linear region) to zero beam emission at a given laser power drive level. Step 219 sets the CUT LEVEL digital value to the step 218 extrapolated value. This CUT LEVEL digital value will be inserted into CUT DAC 133 (FIG. 5) before data processing operations are performed on optical disk 15. Step 220 stores the CUT level value in controller 11. The CUT level value may also be later stored on the received optical disk 15 with an identification of the calibration optical disk drive. In a closed media library, the CUT value may be retentively stored in controller 11.

Machine operation loop 221 calibrates all laser power levels to be used for recording data onto optical disks. If three additional laser power levels are to be calibrated, loop 221 is repeated three times, one repetition for each additional laser power level. A first loop 221 repetition calibrates a laser power level, herein termed P4, that is not only one of the laser power levels to be used for recording data but is also used as a reference laser power level in subsequent repetitions. A recorded laser calibration pattern includes the CUT level and the P4 laser power levels. The P4 power level is varied to find an optimum laser input signal amplitude. In the illustrated embodiment, P4 is a maximum laser power level. No limitation thereto is intended. Subsequent loop 221 repetitions respectively calibrate other laser power levels. Each recorded calibration pattern may have a different signal sequence as may be empirically or otherwise determined. Each calibration pattern for the other laser power levels includes the CUT level, P4 level and a power level being calibrated. The calibration patterns may be empirically determined. Preferably only the laser power level to be calibrated is varied. In an early embodiment of this invention, the laser power level being calibrated is held constant within each of a plurality of disk sectors used in the calibration. The laser power level being calibrated is varied from sector to sector. In each repetition, after reading the recorded calibration patterns, suitable calculations are performed for obtaining a desired laser power level.

In machine operation loop 221, step 222 sets a counter (not shown) in controller 11 for tallying the loop repetitions. Such tally indicates which laser power level is to be calibrated and the calibration pattern to be used. For example, number three may indicate calibrating laser power level P4 and numbers two and three respectively indicate calibrating laser power levels P2 and P3. Step 223 examines the counter for selecting power level to be calibrated and its associated calibration pattern. Step 224 records the calibration pattern in a plurality of sectors on the optical disk being calibrated. Each sector receives a calibration pattern, such pattern being a predetermined repetition of a signal pattern, having a constant amplitude for the laser power level being calibrated. Step 225 reads all of the sector recorded copies of the calibration pattern. Step 226, programmed in controller 11, analyzes the read copies for creating a table of read back signal values for the laser power level being calibrated. Step 227 analyzes the table of values for finding an optimum power for the laser power level being calibrated. A criterion for selecting the optimum laser power level can be empirically determined. Step 228 examines the counter for determining whether all calibrations have been completed. If the counter has a value equal to unity, then loop 221 is exited (DONE=YES). If the counter has a value greater than unity, then step 229 sets the counter for the next laser power level to be calibrated.

In the above-described calibration sequencing, the calibrated laser power levels will have a fixed power relationship between them. A fixed relationship enables an accurate scaling of the laser power levels by scaling DAC 130.

FIG. 10 illustrates, in simplified flow chart form, recalculation of the Scaling DAC digital value. The illustrated flow chart operations may be instituted after a predetermined time delay, detection of predetermined errors, between successive write operations and the like. Step 230 effects writing a laser write a test pulse in one or more test fields 18, such as the above-described ALPC field. Simultaneously to step 230, step 231 measures the laser beam emitted laser test pulse power level by photo diode 37 (FIG. 4). Step 231, using circuits 30 stored the captured laser pulse intensity value in ADC register 71, then forward the captured value to a programmed processor (not shown) in controller 11. Step 232, executed in the programmed processor, compares the laser test pulse value with the original desired scale value of the laser beam. If the values are within a predetermined numerical range then no change is needed. If a predetermined value difference is found (error), then step 233 calculates power level error as a percentage. Step 234 changes the SCALE LEVEL value to adjust for changes in the laser beam intensity. The adjusted SCALE value is then stored in the memory (not shown) and in scaling DAC 130.

While the best mode of practicing the present invention is in an optical disk device, no limitation is intended to limit the practice of this invention to optical disk devices. While the invention has been particularly shown and described with reference to preferred embodiments thereof, it will be understood by those skilled in the art that various changes in form and details may be made therein without departing from the spirit and scope of the invention.

What is claimed is:

1. A laser drive apparatus for supplying to a laser analog laser drive signals at any one of a plurality of diverse laser drive power levels, including, in combination:

the laser responding to said analog laser drive signals for emitting toward a target a laser beam having any one of a plurality of emitted laser beam signal intensities, respectively;

a power-scaling digital-to-analog converter, hereafter scaling DAC, for supplying an analog scaled reference signal;

a plurality of power controlling digital-to-analog converters, hereafter termed scaled DAC's, each of said scaled DAC's for supplying respective diverse analog laser drive signals, all of said scaled DAC's being connected to said scaling DAC for receiving said scaled reference signal for respectively employing said scaled reference signal to generate said analog laser drive power signals having said diverse laser drive power levels; and digital control means connected to said scaled DAC's for actuating predetermined ones of said scaled DAC's for supplying ones of said diverse laser drive power levels to said laser.

2. The apparatus set forth in claim 1, including, in combination:

control means connected to said scaling DAC for changing a power level of said scaled reference signal by a predetermined change power level such that all of said diverse laser drive power levels are changed a predetermined amount.

3. The apparatus set forth in claim 1, including, in combination:

a base array having a plurality of base array DAC's;

primary reference signal means supplying a primary reference signal to said base array DAC's and to said scaling DAC; and combining means electrically interposed between said laser and said base array DACs and between said laser and said scaled DAC's for supplying said laser drive signals to said laser from predetermined ones of said scaled DACs and said base array DACs.

4. The apparatus set forth in claim 3, including, in combination:

said digital control means being connected to said base array DACs, to said scaling DAC, to said scaled DACs and to said combining means;

first means in said digital control means for actuating said scaled DACs to supply first ones of said analog laser drive signals to said laser via said combining means; and second means in said digital control means for actuating predetermined ones of said base array DACs to supply second ones of said analog laser drive signals to said laser via said combining means.

5. The apparatus set forth in claim 4, including, in combination:

said target being an optical disk relatively rotatably disposed with respect to said laser for receiving said emitted laser beam signals from said laser and for reflecting said received laser beam signals for scanning a track on said optical disk as it rotates relative to said emitted laser beam;

optical means optically interposed between said optical disk and said laser for transferring said laser beam signals to said optical disk and for intercepting said reflected laser beam signals for directing said reflected laser beam signals along a given optical path;

first detector means disposed at said given optical path for receiving said reflected laser beam signals for detecting data carried in said reflected laser beam signals;

said optical means having waste light means for directing a predetermined waste light portion of said emitted laser beam signals along a sensing light path;

second detector means in said digital control means disposed on said sensing light path for receiving and detecting said predetermined waste light portion for indicating an emitted light intensity of said emitted laser beam signals as an indication of said emitted light intensity; and adjustment means in said digital control means connected to said second detector means for receiving said indication of emitted light intensity for responding to said indication of emitted light intensity to adjust said scaling DAC to supply a changed scaled reference signal to adjust said intensity of said emitted laser beam signals to a predetermined desired beam intensity.

6. The apparatus set forth in claim 4, including, in combination:

a base one of said base array DACs supplying a predetermined analog base laser beam power signal to said combining means, said predetermined analog laser beam power signal having insufficient power for actuating said laser to emit said laser beam signals;

said second means including a read one of said base array DACs supplying said second ones of said analog laser drive signals and said combining means for being supplied to said laser as write laser drive signals; and said combining means summing said analog base laser beam power signal to said first ones of said analog laser drive signals for supplying to said laser and supplying said second ones of said analog laser drive signals as read laser drive signals.

7. The apparatus set forth in claim 6, including, in combination:

said target being an optical disk relatively rotatably disposed with respect to said laser for receiving said emitted laser beam signals from said laser and for reflecting said received laser beam signals for scanning a track on said optical disk as it rotates;

optical means optically interposed between said optical disk and said laser for transferring said laser beam signals to said optical disk and for intercepting said reflected laser beam signals for directing said reflected laser beam signals along a given optical path;

detector means optically coupled to said optical means for receiving said emitted laser beam signals;

a test area on said optical disk;

said digital control means having scaling test means connected to scaled DACs for actuating said scaled DACs to emit a predetermined test laser drive signal for actuating said laser to emit a test laser beam signal to record in said test area;

said detector means responding to said test laser beam signal to supply a test laser beam intensity indicating signal;

said digital control means having scaling adjustment means connected to said detector means for receiving said laser beam intensity indicating signal;

comparison means in said scaling test means for comparing said laser beam intensity indicating signal with a predetermined desired intensity indicating signal to generate a predetermined error signal; and change means in the scaling adjustment means responsive to said predetermined error signal to change operation of said scaling DAC to reduce an amplitude of said predetermined error signal whereby said laser emits said emitted laser beam signals with a constant laser beam intensity.

8. The apparatus set forth in claim 7, including, in combination:

said combining means having a snubber circuit electrically interposed between said scaled DACs and said laser; and said snubber circuit having a differential circuit for absorbing a transient voltage of said write laser drive signal.

9. The apparatus set forth in claim 7, including, in combination:

said digital control means having an analog-to-digital converter, hereinafter ADC, connected to said detector means for converting said test laser beam intensity indicating signal to a digital intensity signal;

register means connected to said ADC for receiving and storing said digital intensity signal; and said comparison means and said change means consisting of digital circuits for generating and sending a digital value to said scaling DAC.

10. The apparatus set forth in claim 7, including, in combination:

said optical disk having a plurality of addressable data-storing sectors, each one of said addressable data-storing sectors having an ID portion, a test portion and a data portion;

said test area comprising any one of said test portions;

said read one of said base array DACs being an ID DAC for supplying an ID one of said second ones of said analog laser drive signals for reading said ID portion of each of said addressable data-storing sectors;

a data DAC one of said base array DACs supplying a data one of said second ones of said analog laser drive signals for actuating said laser while reading from said data portion of any one of said addressable data-storing sectors; and said ID one and said data one of said second ones of said analog laser drive signals being substantially constant currents, respectively.

11. The apparatus set forth in claim 7, including, in combination:

said digital control means actuating from one to simultaneously actuating up to said plurality of said scaled DACs to generate a number greater than said plurality of said scaled DACs of said diverse analog laser drive power signals.

12. The apparatus set forth in claim 7, including, in combination:

initiation means for indicating receipt of an optical disk or a received optical disk at power up as a calibrate signal;

calibrate means for actuating said laser to emit calibrate ones of emitted laser beam signals;

said detector means responding to said calibrate ones of said emitted laser beam signals to supply respective calibrate indicating signals;

calculation means connected to said detector means for receiving said calibrate indicating signals to calculate a slope of said laser operation on said received optical disk;

base means for extrapolating said slope to zero laser emission to indicate a desired current for said predetermined analog base laser beam power signal and for setting said base one of said base array DACs to supply said desired current as said predetermined analog base laser beam power signal;

scale means connected to said detector means for receiving predetermined ones of said calibrate indicating signals for responding to said predetermined ones of said calibrate indicating signals to generate a digital value indicating a desired said scaled reference signal and for supplying said digital value indicating signal and said desired scaled reference signal to said scaling DAC.

13. A method of operating a laser that emits a laser beam toward a target, including the steps of:

supplying a primary reference signal to a scaling digital-analog-convertor, hereafter scaling DAC;

supplying a scale value to said scaling DAC for generating a scaled reference signal;

supplying said scaled reference signal to a plurality of scaled digital-to-analog convertors, hereafter scaled DACs;

supplying a first plurality of laser power level values to said scaled DACs, respectively, for generating a first plurality of analog laser drive signals;

combining said first plurality of analog laser drive signals into one laser drive signal; and supplying said one laser drive signal to said laser for actuating said laser to emit a laser beam to said target.

14. The method set forth in claim 13, including steps:

measuring said emitted laser beam for generating an intensity indicating signal;

generating a predetermined reference signal;

comparing said intensity indicating signal with said predetermined reference signal to generate a difference signal;

changing said scale value in a direction to reduce said difference signal as a changed scale value; and supplying said changed scale value to said scaling DAC.

15. The method set forth in claim 13, including steps;

providing a first plurality of base array DACs;

supplying said primary reference signal to said base array DACs for generating a first plurality of unscaled laser control signals;

supplying a first plurality of base digital values to said base array DACs, respectively, for actuating said base array DACs to generate said first plurality of said unscaled laser control signals; and alternately supplying predetermined ones of said unscaled laser control signals and analog laser drive signals to said laser.

16. The method set forth in claim 15, including steps:

providing an optical disk as said target;

relatively rotating said optical disk with respect to said laser such that said emitted laser beam scans a data track on said optical disk and reflects said emitted laser beam as back toward said laser as a reflected laser beam;

diverting some of said emitted laser beam as a waste light beam;

detecting an intensity of said waste light beam for indicating the detected intensity as an indication of emitted beam intensity;

comparing said indication of emitted beam intensity with a predetermined desired beam intensity for generating an intensity error signal; and changing said scaling value in a direction and magnitude to reduce said intensity error signal toward zero whereby said laser is controlled to emit said emitted laser beam as a constant relative intensity beam in each of a plurality of diverse levels.

17. The method set forth in claim 16, including steps:

selecting one of said base array DACs as a base DAC;

from said base DAC, supplying a predetermined analog base laser beam power signal; and summing said supplied predetermined analog base laser beam power signal and said one laser drive signal.

18. The method set forth in claim 16, including steps:

providing a test area on said optical disk;

actuating the laser to emit a laser test beam for recording in said test area;

while said laser is emitting said laser test beam, sensing the laser test beam, measuring an intensity of said laser test beam and generating a test beam intensity indicating signal representing said intensity of said laser test beam;

comparing said intensity indicating signal with a desired intensity indicating signal producing an intensity difference signal;

deriving a digital changed signal from said intensity difference signal; and setting said scaling DAC to said digital changed signal for generating a changed scaled reference signal.

19. The method set forth in claim 18, including steps:

providing a plurality of addressable sectors in said optical disk; and inserting in each of said addressable sectors a test area.

20. The method set forth in claim 18, including steps:

actuating said laser with predetermined laser beam power signals to emit a calibrate laser beam having successive diverse beam power levels to said optical disk;

reflecting said calibrate laser beam from said optical disk to a detector;

detecting said reflected laser beam from said optical disk for indicating an intensity of said reflected laser beam for each of said successive diverse beam power levels;

determining a slope of said reflected laser beam against said predetermined laser power signals;

extrapolating said slope to a zero beam power level for indicating a predetermined laser beam power level that results in said laser not emitting a laser beam; and using said predetermined laser beam power level as said base digital value and supplying said base digital value to said base DAC.

\* \* \* \* \*